(12) United States Patent
Courtney et al.

(10) Patent No.: US 12,002,344 B2
(45) Date of Patent: Jun. 4, 2024

(54) CURRENT SENSING DEVICE

(71) Applicant: Ademco Inc., Golden Valley, MN (US)

(72) Inventors: Brian Scott Courtney, Austin, TX (US); Brenden Knecht, Austin, TX (US); Robert W. Boehmer, Lower Burrell, PA (US)

(73) Assignee: Ademco Inc., Golden Valley, MN (US)

( * ) Notice: Subject to any disclaimer, the term of this patent is extended or adjusted under 35 U.S.C. 154(b) by 520 days.

(21) Appl. No.: 17/075,250

(22) Filed: Oct. 20, 2020

(65) Prior Publication Data

US 2021/0118279 A1 Apr. 22, 2021

Related U.S. Application Data

(60) Provisional application No. 62/924,673, filed on Oct. 22, 2019.

(51) Int. Cl.
| | | |
|---|---|---|
| *G08B 21/18* | (2006.01) | |
| *G01R 15/18* | (2006.01) | |
| *G01R 19/00* | (2006.01) | |
| *G01R 22/06* | (2006.01) | |
| *G01R 31/56* | (2020.01) | |

(52) U.S. Cl.
CPC ........... *G08B 21/182* (2013.01); *G01R 15/18* (2013.01); *G01R 19/0092* (2013.01); *G01R 22/06* (2013.01); *G01R 31/56* (2020.01)

(58) Field of Classification Search
CPC .. G08B 21/182; G01R 15/18; G01R 19/0092; G01R 22/06; G01R 31/56
See application file for complete search history.

(56) References Cited

U.S. PATENT DOCUMENTS

| | | | |
|---|---|---|---|
| 9,379,556 B2 | 6/2016 | Haensgen et al. | |
| 10,305,230 B2* | 5/2019 | AbuGhazaleh | ......... H01F 38/30 |
| 2006/0076946 A1 | 4/2006 | Shvach et al. | |
| 2012/0136627 A1 | 5/2012 | Jensen | |

(Continued)

FOREIGN PATENT DOCUMENTS

| | | | | |
|---|---|---|---|---|
| EP | 3477312 | * | 12/2012 | ............. H01F 38/30 |
| EP | 3477312 A1 | | 5/2019 | |
| WO | 2019079213 A1 | | 4/2019 | |

OTHER PUBLICATIONS

Extended Search Report from counterpart European Application No. 20203112.6 dated Feb. 26, 2021, 7 pp.

(Continued)

*Primary Examiner* — Hongmin Fan
(74) *Attorney, Agent, or Firm* — Greenberg Traurig, LLP; Ryan D. Sharp; David J. Dykeman

(57) ABSTRACT

One example provides a device, including: a current sensing mechanism, wherein the current sensing mechanism detects current traveling through a wire of equipment that the device is connected to; an energy harvester electrically coupled to the current sensing mechanism, wherein the energy harvester draws power from a signal associated with the current sensing mechanism; an energy storage unit electrically coupled to the energy harvester, wherein energy harvested from the energy harvester charges the energy storage unit; and a communication device, wherein the communication device transmits information associated with the equipment to another device.

18 Claims, 8 Drawing Sheets

(56) References Cited

U.S. PATENT DOCUMENTS

| | | |
|---|---|---|
| 2016/0146856 A1 | 5/2016 | Komiya et al. |
| 2016/0209454 A1* | 7/2016 | McCammon ............ G01R 1/07 |
| 2018/0031612 A1 | 2/2018 | Blaes et al. |
| 2019/0020290 A1 | 1/2019 | Feng et al. |
| 2019/0056132 A1* | 2/2019 | Warren ................... F24F 11/62 |
| 2019/0113546 A1 | 4/2019 | Jain et al. |
| 2020/0200937 A1* | 6/2020 | Widmer ................ B60L 53/122 |

OTHER PUBLICATIONS

Response to Extended Search Report dated Feb. 26, 2021, from counterpart European Application No. 20203112.6 filed Oct. 28, 2021, 9 pp.

Digi-Key, "Hall-Effect Sensing Provides Current Measurement for the Smart Grid," accessed from https://www.digikey.com/en/articles/hall-effect-sensing-provides-current-measurement-for-the-smart-grid, published Oct. 20, 2015, 1 pp.

\* cited by examiner

CURRENT SENSING DEVICE

This application claims the benefit of U.S. Provisional Patent Application 62/924,673, filed 22 Oct. 2019, the entire content of which is incorporated herein by reference.

TECHNICAL FIELD

The disclosure relates power consumption monitoring of equipment.

BACKGROUND

People have different types of devices in their home, such as air conditioners, pumps, furnaces, electronic devices (e.g., laptop computers, digital assistant devices, tablets, smart phones, etc.), refrigerators, other appliances, garage door openers, and the like. All of these devices require electricity to perform the desired function. Additionally, each of these devices includes components that may fail and render the entire device inoperable or reduce the performance of the device. For example, when a blower motor on a furnace fails, the furnace is no longer able to transfer heat throughout a home. As another example, if the compressor on an air conditioner starts failing, the air conditioner is no longer able to provide cooling as efficiently. Many times, since the device is operating the most frequently during an increased time of need, the devices fail at the most inopportune times, for example, the furnace may fail on the coldest day of the year.

SUMMARY

In general, the techniques of this disclosure describe a power consumption monitoring device that may be attached to any equipment. The device may include processing circuitry configured to analyze power consumption signature of the equipment, compare to an expected performance and determine a state of health of the equipment. In some examples, the processing circuitry of the device may perform rudimentary analysis of the power consumption signature of the equipment and upload the power consumption signature to an external computing device for more detailed analysis.

In summary, one aspect provides a device, comprising: current sensing circuitry, wherein the current sensing circuitry is configured to detect a current signal traveling through a wire of an equipment that the device is connected to; an energy harvester electrically coupled to the current sensing circuitry, wherein the energy harvester draws power from a signal associated with the current sensing circuitry; an energy storage device electrically coupled to the energy harvester, wherein energy harvested from the energy harvester charges the energy storage device; processing circuitry operatively coupled to the current sensing circuitry, and configured to determine a state of health of the equipment based on the detected current signal; and a communication device, wherein the communication device transmits information associated with the equipment to another device, wherein the information comprises the state of health of the equipment.

Another aspect provides a device, comprising: a current transformer, wherein the current transformer is configured to detect a current signal traveling through a wire of an equipment that at least a portion of the device is clamped around; an energy harvester electrically coupled to the current transformer, wherein the energy harvester draws power from a signal output through the current transformer; an energy storage device electrically coupled to the energy harvester, wherein energy harvested from the energy harvester charges the energy storage device; a communication device, wherein the communication device transmits information associated with the equipment to another device, wherein the information comprises the state of health of the equipment; and a receptacle that accepts a plug, wherein connection of the plug allows identification of a current rating for the equipment.

In another example, the disclosure describes a method for determining a state of health of an equipment, the method comprising: receiving, by processing circuitry, an indication of a power consumption of the equipment, determining, by the processing circuitry, a power consumption signature of the equipment based on the indication of the power consumption over a period of time; comparing, by the processing circuitry, the power consumption signature to an expected power consumption signature; determining, by the processing circuitry, the state of health of the equipment based on the comparison; and outputting an indication of the state of health of the equipment.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
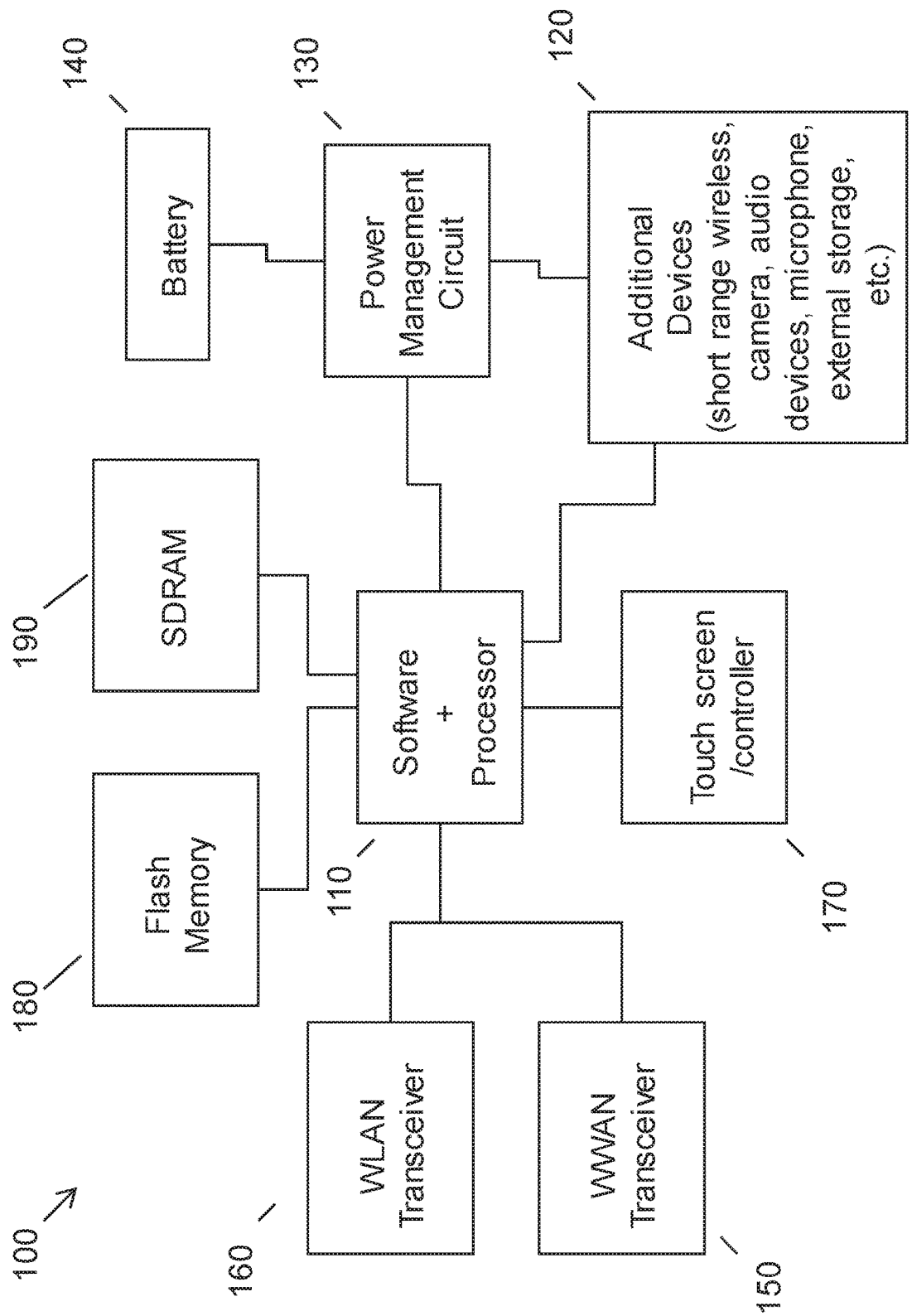
FIG. 1 is a block diagram that illustrates an example of information handling device circuitry.

The techniques of this disclosure describe a power consumption monitoring device that may be attached to any piece of equipment. The device may include processing circuitry configured to analyze a power consumption signature of the equipment and based on the power consumption signature, compare a performance of the equipment to an expected performance to determine a state of health for the equipment. In some examples, the processing circuitry of the power consumption monitoring device may perform analysis of the power consumption signature of the equipment and upload the power consumption signature to an external computing device for more detailed analysis.

Ideally household equipment would provide a warning before a failure occurs. However, equipment may fail with no warning to a user, which can result in significant monetary costs for equipment repairs, which are likely emergency repairs, and also for damage caused the by equipment failure, such as ruined food with a failed freezer or refrigerator, frozen pipes with a failed furnace, a flooded basement with a failed sump pump, and the like. Predicting when a piece of equipment is going to fail can be very difficult. Most equipment has a typical lifespan, and the user can choose to replace the equipment at or near the end of that lifespan or wait until the equipment fails. However, this may result in replacing equipment that may have lasted a few more years because even equipment of the same model from the same manufacturer often have different lifespans due to different operating conditions and other variable factors.

Additionally, even before the end of the lifespan of the equipment, different parts and components on the equipment can begin to malfunction or fail due to different causes. For example, parts may wear out and fail due to extended use or manufacturing defects of the parts. As another example, parts may malfunction due to foreign objects getting into the equipment and causing the equipment to work incorrectly, thereby breaking parts. Different failures can cause the equipment to work differently than expected. For example, if a pump is working harder to pump water, then the pump may draw more current or electricity than under normal operating conditions. As another example, if a foreign object gets lodged in a pump valve, the pump may not expel as much water as under normal operating conditions.

To identify the cause of failures, different equipment performance information may be collected by analyzing the current signal, for example, current draw, real and reactive power, cycle times, current variability and the like. In conjunction with additional information, this current information may be used to determine a state of health of the equipment. For example, when the current draw or cycle time for the equipment is outside an expected range, measuring the equipment behavior based on the electrical current may indicate when the equipment is about to fail or is starting to fail. However, most equipment does not have the ability to capture this information. Generally, any equipment that has the ability to capture this information is equipment used in large facilities (e.g., power generation facilities, manufacturing facilities, production facilities, etc.). This equipment is typically very large and critical to operating facilities that generate large amounts of products and money. Therefore, connecting expensive sensors and monitoring systems to the equipment can be cost effective in these circumstances. However, even if the equipment has the ability to capture performance information, this information is not typically analyzed to determine if the equipment is starting to fail. Rather, the information is used to detect a failure as quickly as possible. Often these facilities have spare parts or spare equipment on hand and technical staff available to quickly repair any failure. To prevent failures or to extend equipment life in these facilities preventative maintenance is often performed at regular intervals.

The techniques of this disclosure may provide advantages to resolve the technical issues described above, when compared to other techniques. Detecting and preventing costly failures of critical equipment may be difficult. The techniques of this disclosure may provide equipment monitoring and analysis at a lower cost when compared to expensive techniques often used at a large facility. The consumer of small household equipment may not have a method for detecting when equipment is not performing as expected, as this equipment does not generally include sensors for monitoring different operating parameters of the equipment. Additionally, even if the equipment did have different sensors, the consumer could not analyze the information obtained to determine if or when the equipment is going to fail. Therefore, the consumer may generally wait until the equipment fails, which may result in high repair or replacement costs, especially when the failure occurs at off-hours, e.g. evenings or weekends. Additionally, the failure of the equipment can cause damage to the home or business (e.g., flooded areas, broken pipes, overheated equipment, etc.) which results in additional costs to fix the damage. In this disclosure, "household" and "consumer" may apply to any of home consumers, small business owners, small city facilities and the like. In addition, the techniques of this disclosure, may be desirable for large facilities as cost-effective techniques for monitoring and predicting equipment performance. The devices and techniques of this disclosure may also allow for retrofitting a monitoring system to existing equipment that was not originally manufactured with such capabilities.

Accordingly, an example of the techniques of this disclosure provide a current sensing device that can be attached to any equipment, including small residential appliances and systems. For ease of readability, the current sensing device will be referred to as a device, and the equipment that the current is being sensed from will be referred to as equipment or apparatus. In this disclosure, "equipment" may apply to a monitored apparatus that may have additional components being monitored, but equipment and apparatus are terms that may generally be used interchangeably. However, these terms are not intended to limit the described system and device in anyway, as the device may be connected to any equipment that requires power for operation. The device may be attached or otherwise coupled to a wire, for example, the power cord, a power wire, or the like, of the equipment. The device includes circuitry that allows the device to detect the power consumption, e.g. electrical current and characteristics of the current, flowing through the wire of the equipment. Using this information the device, or another device, can analyze the electrical current signal to determine if the equipment is performing as expected or if there is anything within the electrical current signal that may indicate that the equipment or component of the equipment may be failing or close to failing.

In some examples, the device may analyze the current signal and determine that the magnitude of current used by the equipment, e.g. the current draw for the equipment, is within an expected range. In other examples, the device may analyze the current signal and determine that the current draw is higher than expected. In some examples, a higher than expected current draw, for example on a motor within the equipment, may indicate that the motor bearings may be failing. In other examples, the current signal may indicate a cycle time for the equipment is outside of an expected range. For example, a current signal history for an air conditioning unit may indicate that the air conditioning equipment is turned on for approximately 30 minutes to cool spaces within a building. The device may analyze the current signal and determine that the cycle time has increased to, for example one hour. Based on the current signal analysis, the device may determine that the equipment appears to be operating abnormally and communicate information associated with the equipment to another device, such as a server within a network of the building, a mobile device, such as a mobile phone, or some other external device.

The device includes a current sensing mechanism with current sensing circuitry such as a current transformer, current transducer, Hall effect sensor, resistor, coil, or any other type of current sensing component. The current sensing mechanism is connected to or otherwise coupled to a power wire of the equipment. The output of the current sensing mechanism is a signal that can be provided to a controller that can process and, possibly, analyze the signal. The controller may also pass the signal onto another device, for example, a gateway device, that may process and analyze the signal or may pass the information onto an external computing device, for example, a household server, a server in a cloud or other data storage location. The device may also include an energy harvesting mechanism that can harvest energy from signal received by the current sensing mechanism to trickle charge an energy storage mechanism (e.g., battery, capacitor, etc.) included within the device. In this disclosure an energy storage mechanism may also be referred to as an energy storage device.

It will be readily understood that the components of the examples, as generally described and illustrated in the figures herein, may be arranged and designed in a wide variety of different configurations in addition to the described example examples. Thus, the following more detailed description of the example examples, as represented in the figures, is not intended to limit the scope of the examples, as claimed, but is merely representative of example examples.

Reference throughout this specification to "one example" or "an example" (or the like) means that a particular feature, structure, or characteristic described in connection with the example is included in at least one example. Thus, the appearance of the phrases "in one example" or "in an example" or the like in various places throughout this specification are not necessarily all referring to the same example.

Furthermore, the described features, structures, or characteristics may be combined in any suitable manner in one or more examples. In the following description, numerous specific details are provided to give a thorough understanding of examples. One skilled in the relevant art will recognize, however, that the various examples can be practiced without one or more of the specific details, or with other methods, components, materials, et cetera. In other instances, well known structures, materials, or operations are not shown or described in detail to avoid obfuscation.

The illustrated examples will be best understood by reference to the figures. The following description is intended only by way of example, and simply illustrates certain examples.

FIG. 1 illustrates an example of information handling device circuitry. While various other circuits, circuitry or components may be utilized in information handling devices, with regard to smart phone and/or tablet circuitry 100, an example illustrated in FIG. 1 includes a system on a chip design found for example in tablet or other mobile computing platforms. In some examples, some or all of circuitry 100 may be found in a gateway or other computing device of this disclosure. Software and processor(s) are combined in a single chip 110. Processors may comprise internal arithmetic units, registers, cache memory, busses, I/O ports, etc. Internal busses and the like depend on different vendors, but essentially all the peripheral devices (120) may attach to a single chip 110. In some examples, circuitry 100 may combine the processor, memory control, and I/O controller hub all into a single chip 110. In some examples, systems including circuitry 100 of this type may or may not use SATA (Serial AT Attachment bus), PCI (Peripheral Component Interconnect bus) or LPC (Low Pin Count bus). Some examples of interfaces may include SDIO (Secure Digital Input Output interface) and I2C (Inter-Integrated Circuit or I-squared-C).

There are power management chip(s) 130, e.g., a battery management unit, BMU, which manage power as supplied, for example, via a rechargeable battery 140, which may be recharged by a connection to a power source (not shown). In at least one design, a single chip, such as 110, is used to supply BIOS like functionality and DRAM memory.

Systems that include circuitry 100 typically includes one or more of a WWAN (wireless wide area network) transceiver 150 and a WLAN (wireless local area network) transceiver 160 or other communication circuitry, e.g. BLUETOOTH, ZigBee and so on, for connecting to various networks, such as telecommunications networks and wireless Internet devices, e.g., access points. Additionally, devices 120 are commonly included, e.g., an image sensor such as a camera, microphones, temperature sensors, pressure sensors, and so on. Circuitry 100 may include a user interface, such as touch screen 170 for data input and display/rendering. Circuitry 100 may also include various computer readable storage, e.g. memory devices, for example flash memory 180 and SDRAM 190.

Figure 2:
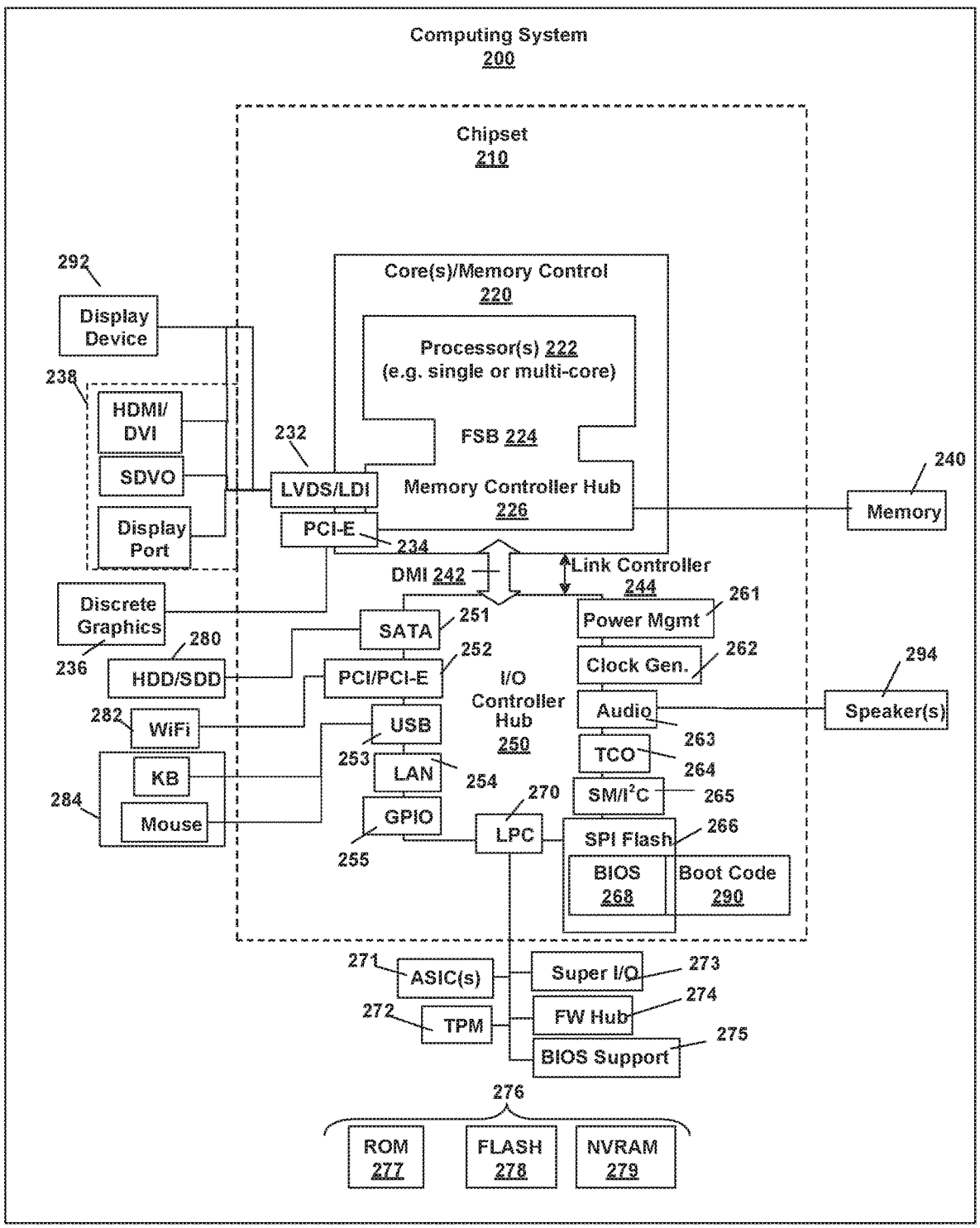
FIG. 2 is a block diagram that illustrates another example of information handling device circuitry.

FIG. 2 depicts a block diagram of another example of information handling device circuits, circuitry or components. Computing system 200 in the example depicted in FIG. 2 may correspond to computing devices such as a laptop computer, a local server for a building, an external server, e.g. a cloud server, a tablet computer or other computing device. As is apparent from the description herein, examples may include other features or only some of the features of the example illustrated in FIG. 2.

The example of FIG. 2 includes a chipset 210 (e.g., a group of integrated circuits, or chips, that work together) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O controller hub 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O controller hub 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling device circuitry, as for example outlined in FIG. 1 or FIG. 2, may be used in devices such as tablets, smart phones, personal computer devices generally, and/or electronic devices which may be connected to the device to analyze the signal received from the current sensing mechanism, for example, as a remote computer, remote data storage device, gateway device, or the like. Additionally, or alternatively, the information handling devices depicted in FIG. 1 or FIG. 2 may correspond to information handling devices or equipment that the current sensing device may be coupled to. For example, the circuitry outlined in FIG. 1 may be implemented in a tablet or smart phone example, whereas the circuitry outlined in FIG. 2 may be implemented in a personal computer example.

Figure 3:
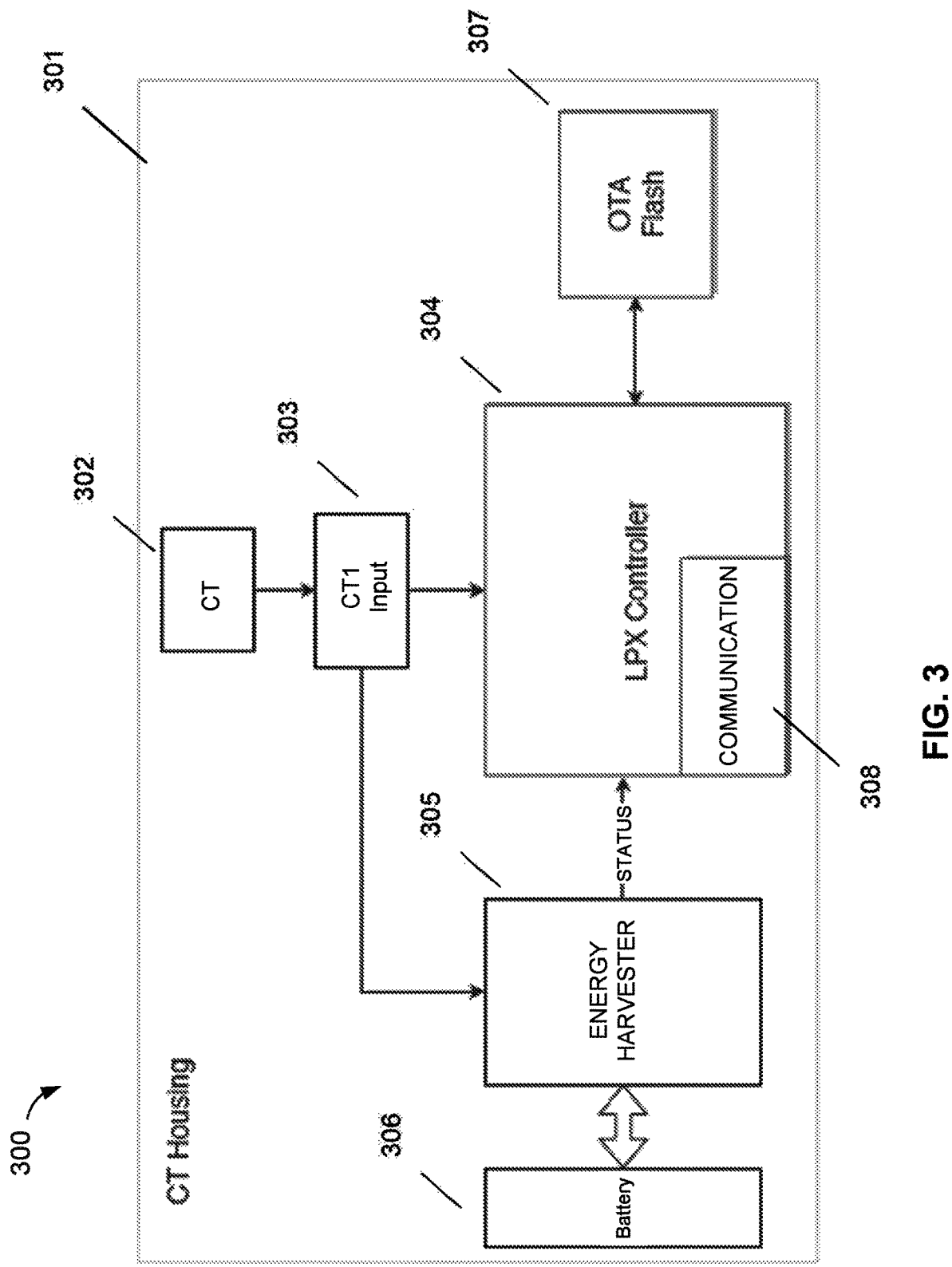
FIG. 3 is a block diagram that illustrates an example power consumption monitoring device according to one or more techniques of this disclosure.

FIG. 3 is a block diagram that illustrates an example power consumption monitoring device according to one or more techniques of this disclosure. The example of FIG. 3 illustrates the components of power consumption monitoring device 300 (device 300 for short) housed in a single housing 301. However, as discussed herein, in different examples device 300 may include multiple housings, with each housing enclosing different components of device 300. Device 300 may be attached to or otherwise coupled to a wire, for example, the power cord, a power wire, or the like, of the equipment. For example, device 300 may be a part of a clamping mechanism that is clamped around the power cord of an equipment. As another example, device 300 may be integrated into a power cord of an equipment, or as a connection interface between the power plug of the equipment and the power socket of a building. The example of FIG. 3 will focus on monitoring power consumption of an equipment by monitoring electrical current drawn by the equipment. In other examples, the power monitoring device of this disclosure may monitor any power characteristics, including any of the power (watts), voltage-amperes reactive (vars) or electrical current (amperage) over time. In this disclosure power consumption monitoring device 300 may also be described as power monitoring device 300 or monitoring device 300.

Device 300 may include housing 301 with current sensing mechanism 302 (CT 302), input component 303 (CT1 input 303), processor 304 (LPX controller 304), memory chip 307 (OTA flash 307), communication component 308, energy harvester 305, and energy storage unit 306 (battery 306). In this example, the components of the power monitoring device may be integrated into the power plug and the current sensing mechanism may run through the power cord. For example, if the current sensing mechanism is a current transformer, then the current transformer (CT) includes a metal component. In an example where the current transformer is integrated into a power cord or cable, the metal component may be drawn into a thin wire that runs the length or a substantial length of the power cord or cable. This arrangement may allow device 300 to be integrated into standard power cables without significantly increasing the size of the power cord or cable. In other example, device 300 may be integrated into a circuit breaker or fuse with all the components of device 300 integrated into the circuit breaker or fuse. Thus, as the equipment draws power from the main power source, device 300 can identify a current signal as the power is drawn through the circuit breaker. The circuit breaker or fuse may also be integrated into the equipment itself. Similarly, device 300 itself may be integrated into the equipment, for example, not as part of a circuit breaker or fuse.

Device 300 may include a current sensing mechanism 302, which is illustrated in FIG. 3 as a current transformer. However, current sensing mechanism 302 is not limited to a current transformer. For example, current sensing mechanism 302 may be a current transformer, current transducer, Hall effect sensor, resistor, coil, or any other type of current sensing component. Current sensing mechanism 302 may also be referred to as current sensing device 302. Current sensing mechanism 302 may be any type of component or mechanism that can sense or detect electric current traveling through a wire or other power consumption signal. Current sensing mechanism 302 then generates a signal that is proportional to or that corresponds to the current. Thus, current sensing mechanism 302 may be a component that directly senses current or may be a component that senses another electrical characteristic (e.g., voltage, resistance, etc.) and that can convert the detected electrical characteristic to a current measurement.

In the example of FIG. 3, current sensing mechanism 302 is illustrated as being contained within the housing 301. In other examples current sensing mechanism 302 may be separate from housing 301. For example, current sensing mechanism 302 may be attached to a power cord of the equipment and connected to housing 301 via input component 303. In some examples, current sensing mechanism 302 may include a plug (not shown in FIG. 3) and housing 301 may include receptacles, e.g. input component 303 for accepting the plug. In other words, the device 300 may include a plug-and-play interface, e.g. input component 303, that receives one or more plugs from one or more current sensing mechanism. The plug-and-play interface may also be configured to detect the amperage range for current sensing device 302. In some examples, housing 301 may be a waterproof and weatherproof housing suitable for use with outdoor equipment, such as a heat pump, air conditioning unit, circuit breaker, attic fan, pumps at water supply facilities, and other equipment located outdoors. In some examples device 300 may connect to a security system, or components of a security system, to monitor operation and ensure that the security system is operating. In some examples, device 300 may be configured to monitor the operation of an automated teller machine (ATM) or similar equipment to ensure the equipment is working as expected.

Device 300 may include multiple receptacles that could accept plugs from multiple current sensing mechanisms or other sensors. For example, device 300 could receive plugs from more than one current sensing mechanism, thereby allowing a user to have a device 300 that can monitor multiple equipment via the use of multiple current sensing mechanisms 302. Alternatively, other sensors, for example, environmental sensors, microphones, and so on may be plugged into device 300 (not shown in FIG. 3). These additional sensors may provide additional information that can be used by device 300 to detect the state of health of an equipment monitored by device 300.

The plug may include components that can be used to detect a current rating of current sensing mechanism 302. For example, the plug may be similar to a headphone jack which has different contact areas. These contact areas can be utilized to detect different impedances between the components. Electrical current sensing mechanisms having different current ratings would have different impedances between the contact areas. For example, a current sensing mechanism having a current rating of 20 A may be configured with one impedance between the contact areas, while a 40 A current rating would be configured with a different impedance between the contact areas. Different configurations of impedances may be used for different current ratings. For example, different current sensing mechanisms may have 20 A, 40 A, 50 A, 100 A, 400 A, and the like, ratings. Thus, when the plug is plugged into a receptacle of the housing 301, processing circuitry 304 device can identify the current rating for current sensing mechanism 302 based on connections between a subset of impedance components.

Additionally, since the current rating of current sensing mechanism 302 is known, the system can identify if the correct current sensing mechanism is being used for the equipment. In other words, if the equipment has a current rating over the current rating of the current sensing device, the system can identify this mismatch. Upon identification of a mismatch, device 300 may output a signal or an alert, e.g. via communication component 308, indicating that current sensing mechanism 302 is the incorrect mechanism for the equipment. This signal or alert may be as simple as illuminating a light on current sensing mechanism 302 or may be as complex as sending a signal to an information handling device (e.g., smartphone, laptop computer, tablet, smartwatch, etc.) of a user that then results in a notification being displayed on the information handling device, such as circuitry 100 and computing system 200 described above in relation to FIGS. 1 and 2.

Current sensing mechanism 302 may output a signal is output that corresponds to the current running through the wire. This signal may run through receptacles 303 that allows for part of the signal to be directed to an energy harvesting mechanism 305. In the example in which current sensing mechanism 302 is separate from housing 301, receptacles 303 may be contained or connected to the receptacle that receives the plug of current sensing mechanism 302. In the case that housing 301 and current sensing device 302 are included in the same housing, receptacles 303 may be a separate component or may be integrated into the energy harvesting hardware mechanism of energy harvester 305. The energy harvester 305 is electrically coupled to current sensing mechanism 302, for example, through the receptacles 303. As a signal is output by current sensing mechanism 302, or by capturing some of the signal input to the current sensing mechanism 302, part of the signal may be directed to the energy harvester 305. In other words, energy harvester 305 draws power from a signal associated with the current sensing circuitry. In the example in which the current sensing circuitry is a current transformer, the signal may be a current generated by the current transformer. In the example of other current sensing circuitry, the energy harvester may be coupled to the signal associated with the current sensing circuitry.

Energy harvester 305 uses this to charge energy storage unit 306. Energy storage unit 306 may be a rechargeable battery or may be another type of component that can store energy. For example, energy storage unit 306 may be a super-capacitor that stores energy. Energy storage unit 306 may be used to provide power to the rest of device 300 circuitry. In some examples, energy storage unit 306 may include a lithium-ion battery for use in cold locations and a nickel-metal-hydride (NiMH) battery for use in hot locations.

Processor 304 (LPX controller 304) receives the signal from current sensing mechanism 302. In FIG. 3, the processor is depicted as an LPX controller. However, processor 304 can be any type of processor, microcontroller, or other type of processing circuitry. Examples of processor 304 may include any one or more of a microcontroller (MCU), e.g. a computer on a single integrated circuit containing a processor core, memory, and programmable input/output peripherals, a microprocessor (μP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller," as used herein, may refer to any one or more of the foregoing structures or any other structure operable to perform techniques described herein.

Processor 304 may read the signal from current sensing mechanism 302, e.g. via an analog to digital converter, ADC, not shown in FIG. 3. Processor 304 may also analyze and process the signal to identify characteristics of the equipment based upon the power consumption signal from current sensing mechanism 302. The characteristics may be used to determine if the equipment is performing as expected. If there is a deviation from the expected characteristics of the equipment, the system may determine that the equipment is experiencing an abnormal operating condition. Using analytics, the system may determine what the abnormal operating condition is, for example, whether the equipment or some component is failing. In some examples processor 304 may correlate the characteristics of the received power consumption signal to signals from other sensors, e.g. a temperature sensor indicating that the equipment experiencing changes environmental conditions, a microphone indicating an unusual noise frequency or noise level, or the like. In some examples, a microphone may detect sediment buildup in a tank, such as a water tank, well pressure tank, water softener and so on. In some examples, processor 304 may provide an alert or other notification to a user of the abnormal condition.

In some examples, processor 300 may perform rudimentary analysis of the performance characteristics of the monitored equipment (not shown in FIG. 3), based on the power consumption signal, and input from other sensors. In some examples, processor 300 may upload the power consumption signal to another computing device, e.g. a computing device with more powerful computing capability, such as a server, laptop, mobile device, and so on. Alternatively, rather than device 300 analyzing and processing the signal, device 300 may include a communication component 308, that allows for the signal to be sent to the other computing device. As shown in FIG. 3, communication component 308 is integrated into processor 304 hardware. However, communication component 308 may be a component separate from processor 304. Communication component 308 may be a wireless communication device, an antenna, a hardware port that allows for a wired communication connection, or the like. Communication component 308 may transmit information associated with the monitored signal to another computing device. The computing device that receives the information from the communication component, for example, a remote computer, gateway device, or the like, may then analyze and process the signal. As an alternative, both device 300 and second computing device that receives information may process and analyze the power consumption signal or different portions of the signal. Once the signal has been processed and analyzed, different parameters of the equipment can be identified. This information can then be stored in a data storage location, for example, a cloud data storage location, remote/network data storage location, local data storage location, e.g. memory chip 307, or the like. The stored information may then be used to identify historical trends of the equipment, comingled with information from other equipment to identify geographical trends or parameters of equipment, or the like.

Device 300 may also include other components. For example, device 300 may also include a memory chip 307 (OTA flash 307) for storing data. In FIG. 3 memory chip 307 is identified as an OTA (over-the-air) flash memory chip. However, any type of memory chip or computer readable storage media may be utilized. Memory chip 307 may store firmware updates for processor 304, a subset of historical signals received from current sensing mechanism 302, current firmware for processor 304, or the like. The firmware updates may be provided over-the-air so that device 300 never has to be plugged into another information handling device. Firmware, or software stored at memory chip 307 may include instructions that cause processor 304 to execute the functions described herein. Additionally, memory chip 307 may store some information related to the signals received from current sensing mechanism 302. For example, if device 300 cannot wirelessly connect or loses the connection to the second computing device that the information is being sent to, memory chip 307 may store the signal information until a connection can be made.

Figure 4:
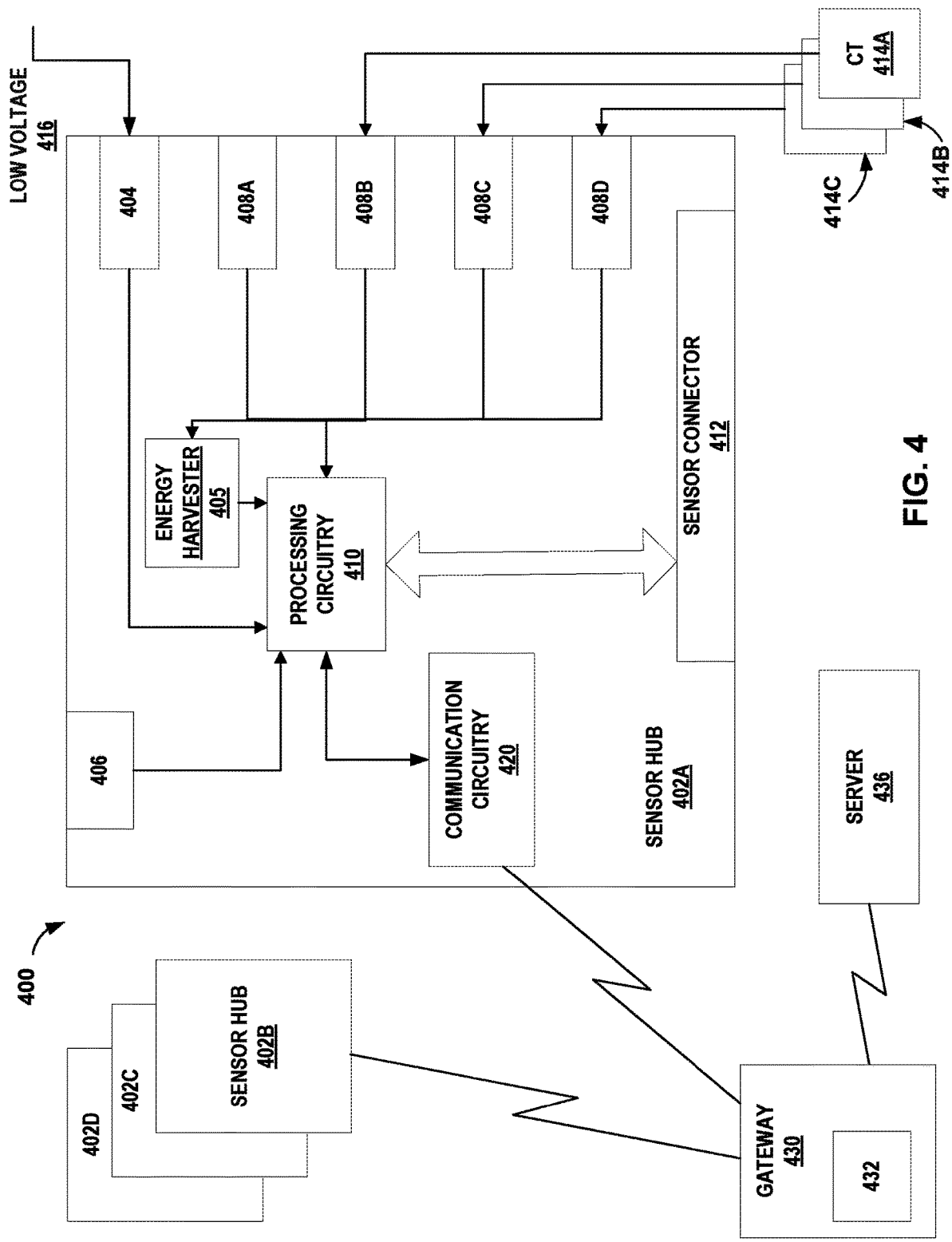
FIG. 4 is a block diagram that illustrates an example power consumption monitoring including a sensor hub and separate current monitoring mechanisms according to one or more techniques of this disclosure.

FIG. 4 is a block diagram that illustrates an example power consumption monitoring system including a sensor hub and separate current monitoring mechanisms according to one or more techniques of this disclosure. Power consumption monitoring system 400 is an example of device 300 described above in relation to FIG. 3 and may have similar functions and characteristics.

System 400 may include sensor hub 402A connected to one or more power sensors, such as current transformers CT 414A-414C. Sensor hub 402A may communicate with server 436 via gateway 430 via communication circuitry 420. Alternatively, or additionally, sensor hub 402A may communicate directly with server 436 (not shown in FIG. 4). Gateway 430 may also communicate with additional sensor hubs, e.g. sensor hubs 402B-402D and may also communicate with server 436. Each of sensor hubs 402B-402D may include one or more power sensors, such as a current transformers or similar power sensor. Gateway 430, server 436, a cloud server (not shown in FIG. 4) may all be examples of an external computing device that communicates with sensor hubs 402A-402D.

Current transformers 414A-414C are examples of CT 302 described above in relation to FIG. 3 and have similar functions and characteristics. In some examples CT 414A-414C (collectively CT 414) may clamp around a power supply cord for household equipment or equipment to measure the power consumption characteristics over time for the equipment. As described above, examples of an apparatus or "household" equipment may include any of a heating, ventilation and air conditioning (HVAC) system, a pump, freezer, refrigerator/freezer combination, garage door opener, evaporative cooler, laboratory equipment, pool filter pumps, lighting, appliances, fans, and other similar examples installed in structures or facilities, not limited to living spaces. In some examples, equipment may include one or more components that may be identified by characteristic power consumption signals. For example, a furnace may include components such as an igniter, one or more blowers, electric heating elements, and so one that may each be identifiable during different phases of an operational cycle for the equipment. CT 414 may connect to sensor hub 402 via input components 408A-408D, which are examples of input component 308 described above in relation to FIG. 3. In some examples CT 414 may connect to the receptacles of input components 408A-408D with a plug. The connection of the plug may allow identification of a current rating for each current transformer as well as provide an input to couple the indication of the power consumption signature to processing circuitry 410 for analysis. In some examples, each of CT 414A-414C may clamp to a separate phase of a 3-phase equipment and provide sensor hub 402 information to monitor each phase separately.

Processing circuitry 410 is an example of processor 304 described above in relation to FIG. 3 and has similar functions and characteristics. Processing circuitry 410 may receive and analyze power consumption signals from input components 408A-408D, as well as any sensors connected to sensor connector 412, control the operation of communication circuitry 420 and of energy harvester 405. Additionally, processing circuitry may include, or be coupled to computer readable storage media (not shown in FIG. 4).

Energy harvester 405 is an example of energy harvester 305 described above in relation to FIG. 3. Energy harvester 405 may comprise circuitry that receives current generated by CT 414, caused by current used by a monitored equipment (not shown in FIG. 4) passing through CT 414, and use the current to trickle charge an energy storage device, such as energy storage unit 306 described above in relation to FIG. 3 (not shown in FIG. 4). In some examples, energy harvester 405 may directly provide electrical power to processing circuitry 410, communication circuitry 420 and other components of sensor hub 402 or extend the life of the energy storage device. Energy harvester 405 may be implemented using circuitry such as a charge pump and voltage regulator or an off the shelf energy harvester solution.

Sensor hub 402 may also receive operating power from a low voltage A/C source 416 via connection 404. In some examples, sensor hub 402 may be located to monitor operation of an HVAC system, which may transform line power to a low voltage A/C source for use by the HVAC system. Sensor hub 402 may use a low voltage A/C source to directly power sensor hub 402 and/or to charge an energy storage device. In other examples, sensor hub 402 may receive operating power from a D/C source via D/C connector 406. For example, connector 406 may be configured to connect to a D/C switching power supply connected to line power.

Sensor connector 412 may provide connection terminals for processing circuitry 410 to receive signals from other sensors. As described above in relation to FIG. 3, some examples of other sensors may include a camera, light sensor, temperature sensor or other environmental sensor, microphone, water leak sensor, magnetic field sensor, and similar sensors. In some examples, processing circuitry 410 may use information from other sensors to analyze the power consumption signals from the monitored equipment. For example, processing circuitry 410 may determine that the power consumption during a period of time of the operating cycle for the monitored equipment is higher (or lower) than expected. During the same period, a microphone may detect an increase sound level, change in sound frequency or some other sound characteristic. Processing circuitry 410 may use the inputs from the multiple sensors to determine a state of health for the monitored equipment. In other examples, processing circuitry 410 may cause communication circuitry 420 to transmit the received signals to gateway 430 and/or server 436 for more detailed analysis by more powerful processing circuitry at gateway 430 or server 436.

Communication circuitry 420 is an example of communication circuitry 308 described above in relation to FIG. 3 and may have similar functions and characteristics. In some examples communication circuitry 420 may also have characteristics of other communication circuitry such as WLAN 160 and WWAN 150 described above in relation to FIG. 1. In other examples, communication circuitry 420 may also include wired communication circuitry such as Ethernet and may connect to gateway 430 and/or server 436 with an RJ45 or similar wired connection.

Gateway 430 may be configured to communicated via wired or wireless channels to sensor hubs 402A-402D and with server 436. In some examples, gateway 430 may establish wireless communication using radio frequencies (RF) that pass through walls and other structures with little attenuation, such as frequencies in the sub-GHz range used for wireless landline telephone systems, e.g. approximately 800-900 MHz. The frequencies used by gateway 430 may be configurable based on the country or region in which system 400 is installed. For example, some countries may only allow gateway 430 to operate within a specified frequency band, such as 900-930 MHz. When located in a different country or region, gateway 430 may be configured to operate in compliance with the regulations for that region. In some examples, gateway 430 may operate at frequencies that require reduced power when compared to other frequencies, yet still pass through structures to provide reliable communication. Reduced power may be desirable to prolong battery life.

In some examples, gateway 430 may include processing circuitry 432, and other components not shown in FIG. 4. Gateway 430 may be configured to pair with the one or more sensor hubs 402A-402B. To conserve limited battery power a sensor hub may operate in a wake-sleep cycle. A sensor hub may be configured to wake when one or more of CT 414, or other sensor, is collecting information regarding a monitored equipment. In some examples, a sensor hub may initiate a communication session with gateway 430, for example, when first coupled to a power supply cable of equipment. Gateway 430 may assign the sensor hub, e.g. sensor hub 402C, a predetermined communication window, e.g. a transmit time, within a communication period. For example, a communication period may be set to one hour, one minute, or any other length of time. Gateway 430 may set the communication window for sensor hub 402C to start at ten seconds past the hour. Gateway 430 may establish the respective communication window for each respective sensor hub, for example in a staggered series of communication windows based on the communication period. During the communication window, each respective sensor hub may wake up to transmit and receive updated information for the communication period. In this manner, each respective sensor hub may conserve electrical energy stored in each respective energy storage device.

In some examples, one or more portions of system 400 may operate under internet of things (IoT) principles. In some examples, gateway 430 may assign an internet protocol (IP) address, or address under a similar protocol, for each sensor hub paired with gateway 430. In some examples gateway 430 may assign an IP address to each sensor of system 400, e.g. an IP address for CT 414A-414C, a microphone or temperature sensor connected to sensor connector 412 and so on.

In the example of system 400, server 436 is a computing device that may be located near gateway 430, or externally, such as a cloud server. In the example of a local server, server 436 may be a server located on the same LAN as gateway 430, e.g. in the same building. In other examples, a mobile device, such as a mobile phone or tablet computer may function as server 436. In some examples server 436 and gateway 430 may be examples of circuitry 100 and computing system 200 described above in relation to FIGS. 1 and 2.

In operation, sensor hubs 402A-402D may perform rudimentary analysis of sensor inputs such as power consumption signals and other sensor inputs in some examples. Rudimentary analysis may include comparing, at various scales, signatures in the power consumption signals to expected power consumption signals, include real and reactive power, to determine whether the equipment is performing normally, e.g. as expected. In some examples, the sensor hub may communicate only that the equipment completed an operational cycle as expected. In other examples, the sensor hub may provide more or less information about an operational cycle at varying level of detail. In some examples, the sensor hub may only provide information if a monitored equipment appears to depart from the expected characteristic power consumption signature, e.g. by more than a threshold amount. For example, a power consumption signal received by a power sensor may indicate that a blower motor drew more than expected or less than expected current, operated for longer than or for less time than expected or operated out of an expected operating sequence. Examples of an operational cycle may include a garage door opening or closing, a freezer compressor running, or a defrost cycle for the freezer, a defrost cycle for a heat pump, a furnace run, e.g. including igniting the furnace, turning on the circulation blower, turning off the blower and so on.

Figure 5:
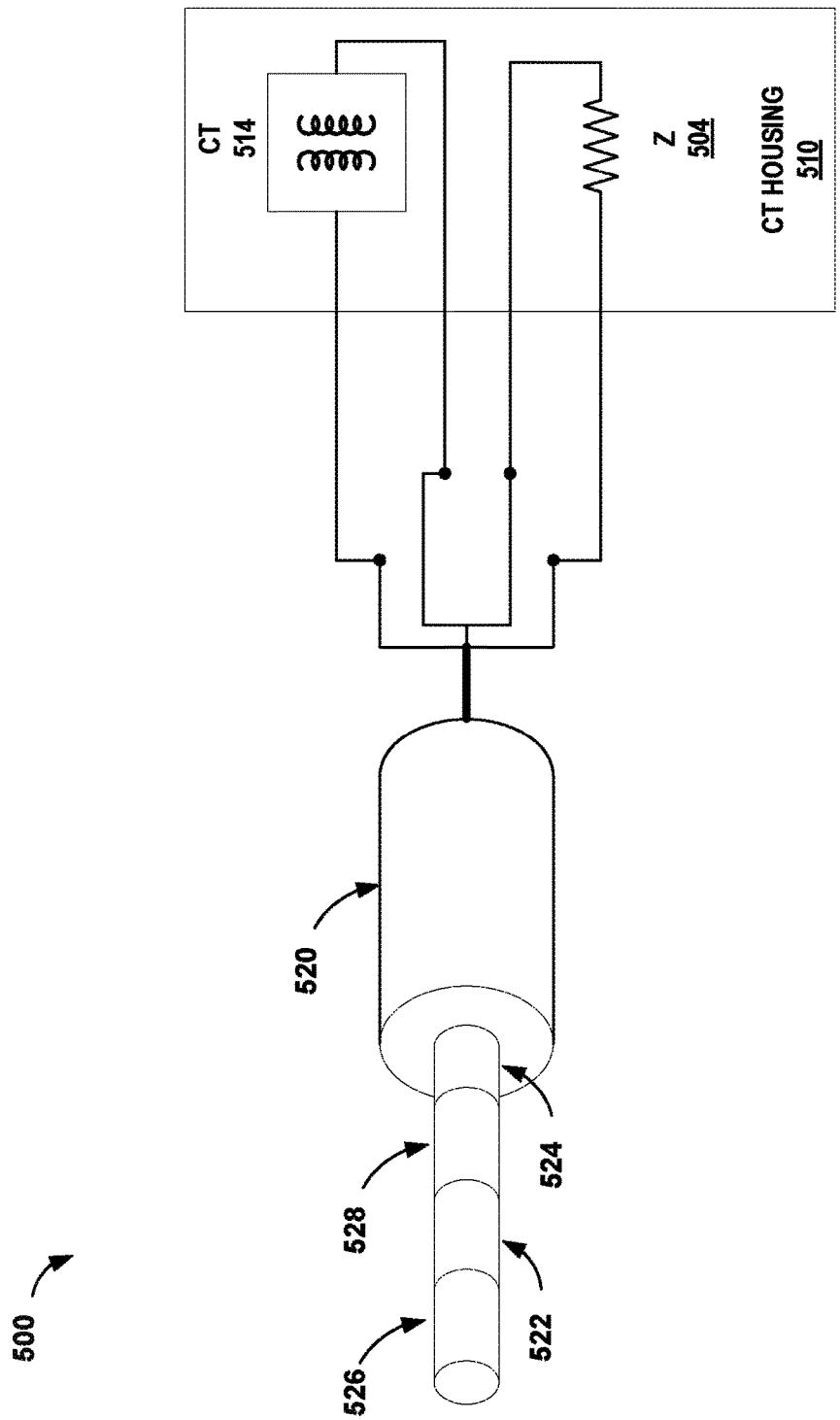
FIG. 5 is a conceptual diagram illustrating an example plug configured to identify and carry signals from a power sensor according to one or more techniques of this disclosure.

FIG. 5 is a conceptual diagram illustrating an example plug configured to identify and carry signals from a power sensor according to one or more techniques of this disclosure. Power monitoring device 500 is an example of CT 414A-414D and CT 302 described above in relation to FIGS. 3 and 4 and may have similar functions and characteristics.

In the example of FIG. 5, power monitoring device 500 includes plug 520 with electrical contacts 522, 524, 526 and 528 connected to a current transformer CT 514 and an example impedance Z 504, which are enclosed in CT housing 510. As described above in relation to FIG. 3, CT housing 510 may be configured to be waterproof and/or weatherproof. As described above for CT housing 301, in some examples CT housing 510 may also include processing circuitry, memory, communication circuitry and other components not shown in FIG. 5. In other examples, CT housing may include only CT 514 and impedance Z 504. In some examples, plug 520 may be a standard sized headphone plug, e.g. 2.5 mm, 3.5 mm or similar size. In other examples, plug 520 may include more or fewer electrical contacts, e.g. plug 520 may include three electrical contacts rather than the four electrical contacts 522-528 depicted in FIG. 5. Other sensors, e.g. a temperature sensor, microphone, etc. may connect to a sensor hub, e.g. via sensor connector 412, depicted in FIG. 4 using a similar plug.

CT 514 may be electrically connected to two of the four electrical contacts shown as part of plug 520. As described above in relation to FIGS. 3 and 4, CT 514 may generate an electrical current based on being clamped to a power supply cord of a monitored equipment. When plug 520 is connected to a receptacle on the sensor hub, such as input components 408A-408D, the sensor hub may use the magnitude of the current to determine the magnitude of current over time used by the monitored equipment. The sensor hub may also use the current to charge an energy storage device used to power the sensor hub.

Impedance Z 504 may connect to two of the electrical contacts of plug 520. In some examples, one of the electrical contacts may be in common with one of the electrical contacts connected to CT 514. Impedance Z 504 may be any resistance or other impedance that may be used to identify characteristics of power monitoring device 500. Though shown as a single resistor in the example of FIG. 5, impedance Z 504 may include a plurality of impedance components, such as resistors, capacitors, inductors, active devices and so on. In some examples, the value of impedance Z 504 may identify one or more characteristics of power monitoring device 500 such as current rating, cable clamp size, weight, indoor or outdoor capability and so on. In some examples impedance Z 504 may be a short circuit, which may indicate, for example a current rating of 120 amps. In North America, a current rating of 120 amps may be suitable for equipment such as a refrigerator, a furnace, some laboratory or other testing equipment, and so on. A different value of impedance Z 504 may indicate a different current rating, such as 220 amps, which may be suitable for an air conditioning unit, electric dryer, heat pump, or similar equipment.

As described above in relation to FIG. 3, in some examples, processing circuitry of a sensor hub may determine whether there is a mismatch between the current rating of power monitoring device 500 and the equipment to which it is attached. For example, the characteristic power consumption signature may indicate that power monitoring device 500 is connected to an electric dryer, but impedance Z 504 may indicate that CT 514 is only rated for 20 Amps. In other examples, the characteristic signature may be clipped or otherwise distorted because CT 514 may be inappropriately attached to equipment for which CT 514 is not rated. The processing circuitry may output an alert, or otherwise indicate that power monitoring device 500 may be incorrect for the monitored equipment. In this manner power monitoring device 500, with plug 520 may provide a plug-and-play function in connection with a sensor hub of this disclosure.

Figure 6:
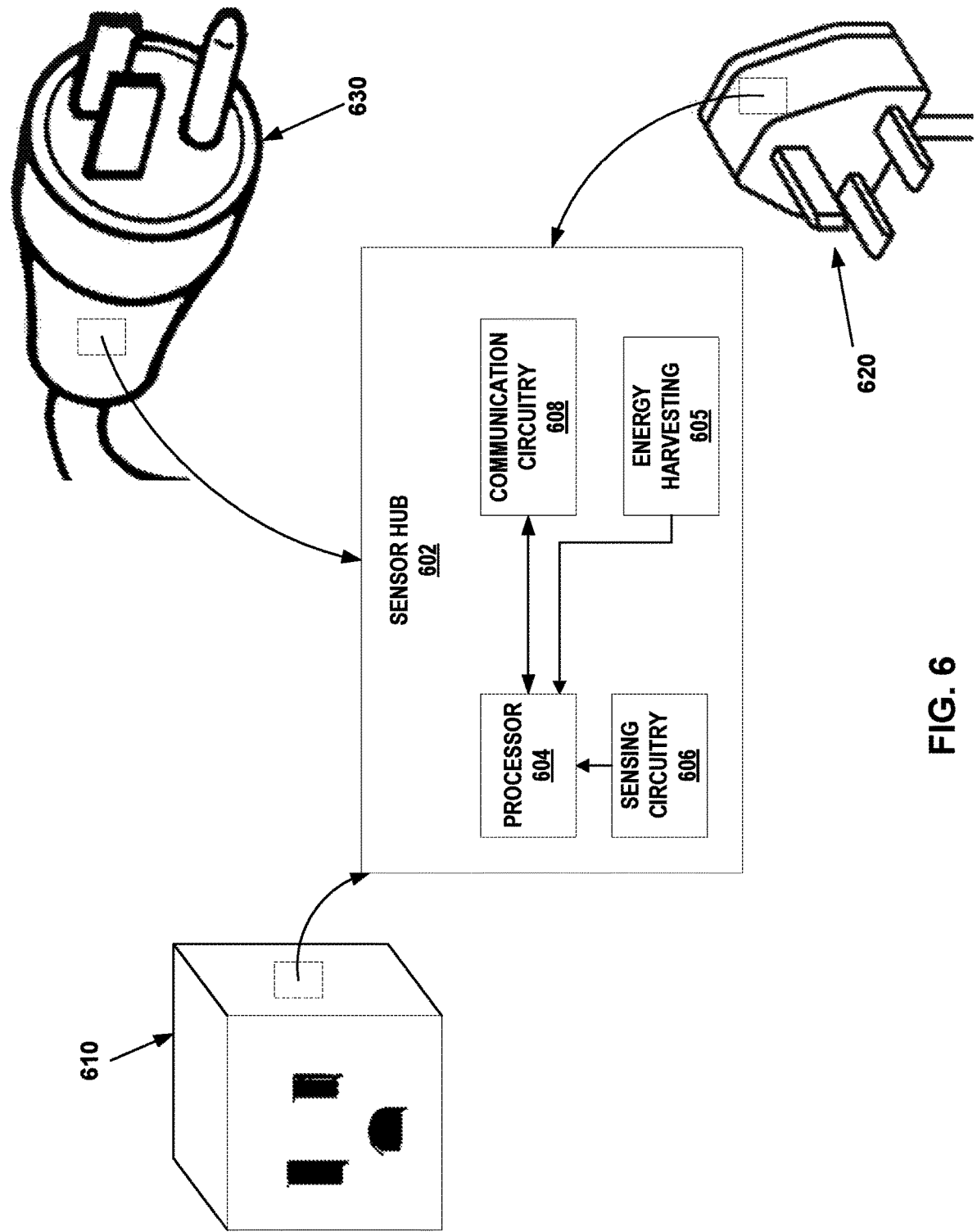
FIG. 6 is a conceptual diagram illustrating example sensor hubs according to one or more techniques of this disclosure that may be integrated into other forms.

FIG. 6 is a conceptual diagram illustrating example sensor hubs according to one or more techniques of this disclosure that may be integrated into other forms. Sensor hub 602 is an example of sensor hub 402 and power monitoring device 300, described above in relation to FIGS. 3 and 4 and may have the same functions and characteristics.

Sensor hub 602 may include one or more processors 604, communication circuitry 608, sensing circuitry 606, energy harvesting circuitry 605 and other components not shown in FIG. 6. Sensor hub 602 may be integrated into receptacle 610, and power plugs 620 and 630. In some examples power plugs 620 and 630 may be connected to equipment being monitored by sensor hub 602. In some examples receptacle 610 may be part of a power supply for a building. In other examples, receptacle 610 may be a stand-alone unit with plug prongs (not shown in FIG. 6) on the opposite side of the receptacle face. In this manner, receptacle 610 may be inserted between any equipment and the power supply to monitor the performance of the equipment.

In some examples sensing circuitry 606 may include a current transformer, Hall sensor, or some other sensor configured to measure power, electrical current, vars or other power signals passing through receptacle 610 and power plugs 620 and 630. Sensing circuitry 606 may also include other circuitry, such as temperature sensors, amplifiers, filtering circuitry and so on to provide additional information to processor 604. Energy harvesting circuitry 605 may be configured to use some of the electrical energy passing through receptacle 610 and power plugs 620 and 630 to power sensor hub 602 directly or to charge an energy storage device (not shown in FIG. 6). In other words, energy harvesting circuitry 605 may draw power from a signal associated with current sensing circuitry 606.

As described above in relation to FIG. 4, communication circuitry 608 is an example of communication circuitry 420 and may have similar functions and characteristics. For example, communication circuitry 608 may transmit collected performance data to another computing device, such as gateway 430 and or server 436. Also, communication circuitry 608 may receive an identification and characteristics of the apparatus to which it is connected, such as expected power consumption signals.

Figure 7:
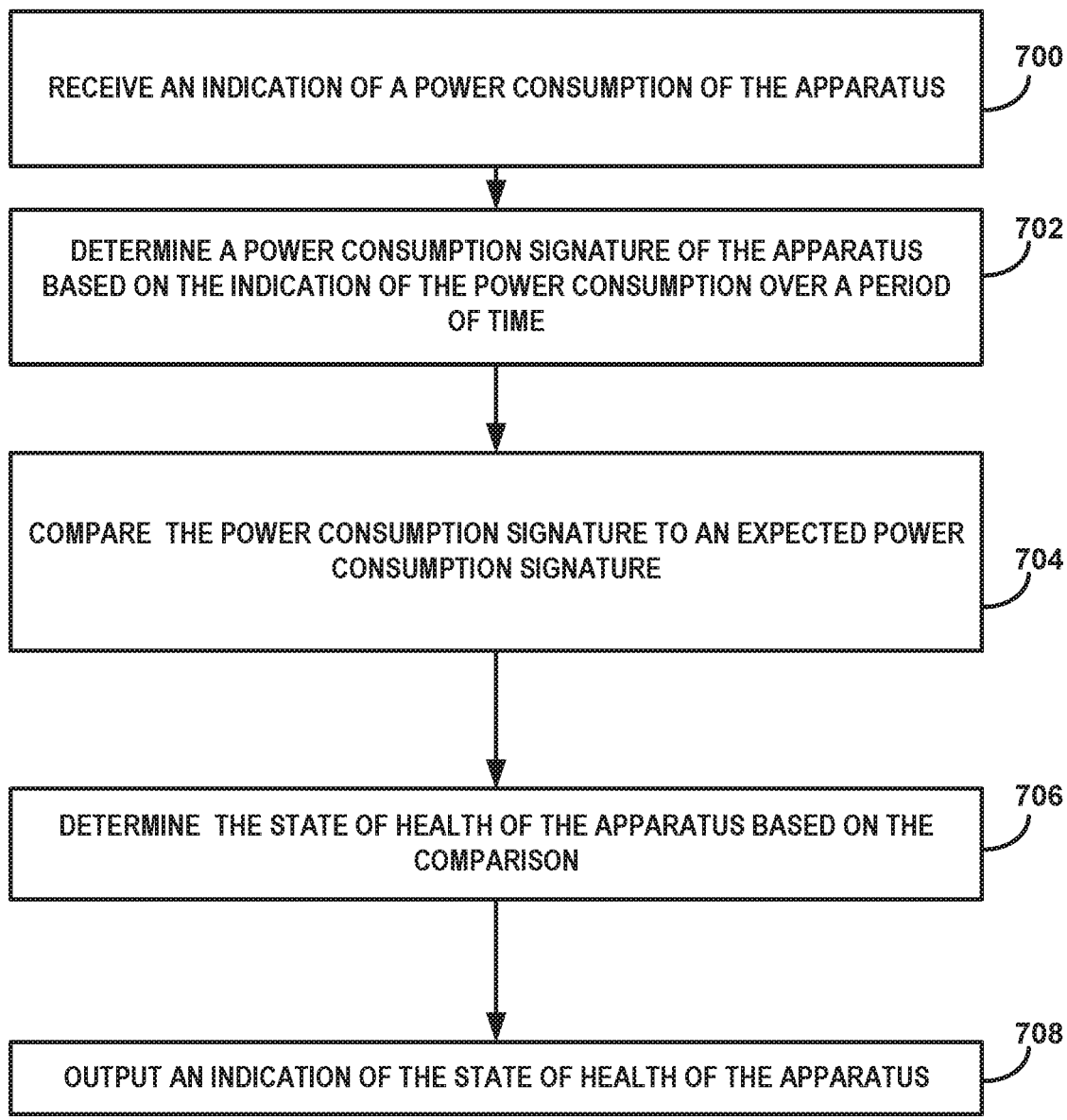
FIG. 7 is a flowchart illustrating an example operation of a power monitoring system according to one or more techniques of this disclosure.

FIG. 7 is a flow diagram illustrating an example operation of the power consumption monitoring device of this disclosure. The blocks of FIG. 7 will be described in terms of FIGS. 3 and 4 unless otherwise noted.

A power consumption monitoring device may include processing circuitry, such as processor 304, processing circuitry 410 or processor 604. The processing circuitry may receive an indication of power consumption of an equipment from a power sensing component, such as current transformer 302 or current transformer 414A (700). In the example of a current transformer coupled to a power cord of an equipment, such as an HVAC system, laboratory equipment and so on, the current transformer may generate a current proportional to the current consumed by the equipment. The generated current may provide the indication of power consumption of the equipment to the processing circuitry. In other examples, other sensors, such as a Hall sensor, an inline resistor and so on may also provide a voltage signal to the processing circuitry to indicate the power consumption of the equipment.

The processing circuitry may determine a power consumption signature of the equipment based on the indication of the power consumption over a period of time (702). In some examples the period of time may be an operational cycle of the equipment, e.g. a garage door opening cycle, a furnace run, a washing cycle for a washing machine, and so on. In other examples, the period of time may be based on a different timing, e.g. a minute, an hour, a daily measurement, and so on. In other examples the period of time may be governed by some external trigger, e.g. while the outside air temperature is below a threshold temperature, a tank is below a threshold fluid level and so on. In other examples, the period of time for a first equipment may be governed by the operation of a second equipment, e.g. when the second equipment starts up, shuts down, performs an operation cycle, or some other criteria.

The processing circuitry may compare the power consumption signature to an expected power consumption signature (704). As described, for example in FIG. 4, the power consumption signature may describe a sequence of operations, and may include shapes such as increasing slope, decreasing slope, spikes, characteristics of both real and reactive power signals, and so on. The processing circuitry may determine whether the measured power consumption signature matches the expected power consumption signature within allowed tolerances. An equipment that shows an unusual sequence, higher than expected current spikes, or other deviations from the expected signature may provide an indication of impending malfunction, or otherwise indicate the equipment needs attention.

The processing circuitry may determine the state of health of the equipment based on the comparison (706). For example, a pump that runs longer than expected may indicate a blockage or flow restriction that prevents the pump from filling or emptying a tank as expected. In other examples, a motor that has an indication of a higher than expected current consumption may indicate an increase in friction, such as a bearing beginning to fail.

The processing circuitry may output an indication of the state of health based on the comparison (708). In some examples, the processing circuitry may cause communication circuitry to indicate that the equipment if functioning normally in the example when the measured power consumption signature approximately matches the expected signature. In other examples, the processing circuitry may only output an alert or other indication of the state of health if the processing circuitry detects that the measured signature is outside an allowable performance boundary of time or magnitude from the expected signature.

As will be appreciated by one skilled in the art, various aspects may be embodied as a system, method or device program product. Accordingly, aspects may take the form of an entirely hardware example or an example including software that may all generally be referred to herein as a "circuit," "module" or "system." Furthermore, aspects may take the form of a device program product embodied in one or more device readable medium(s) having device readable program code embodied therewith.

Figure 8:
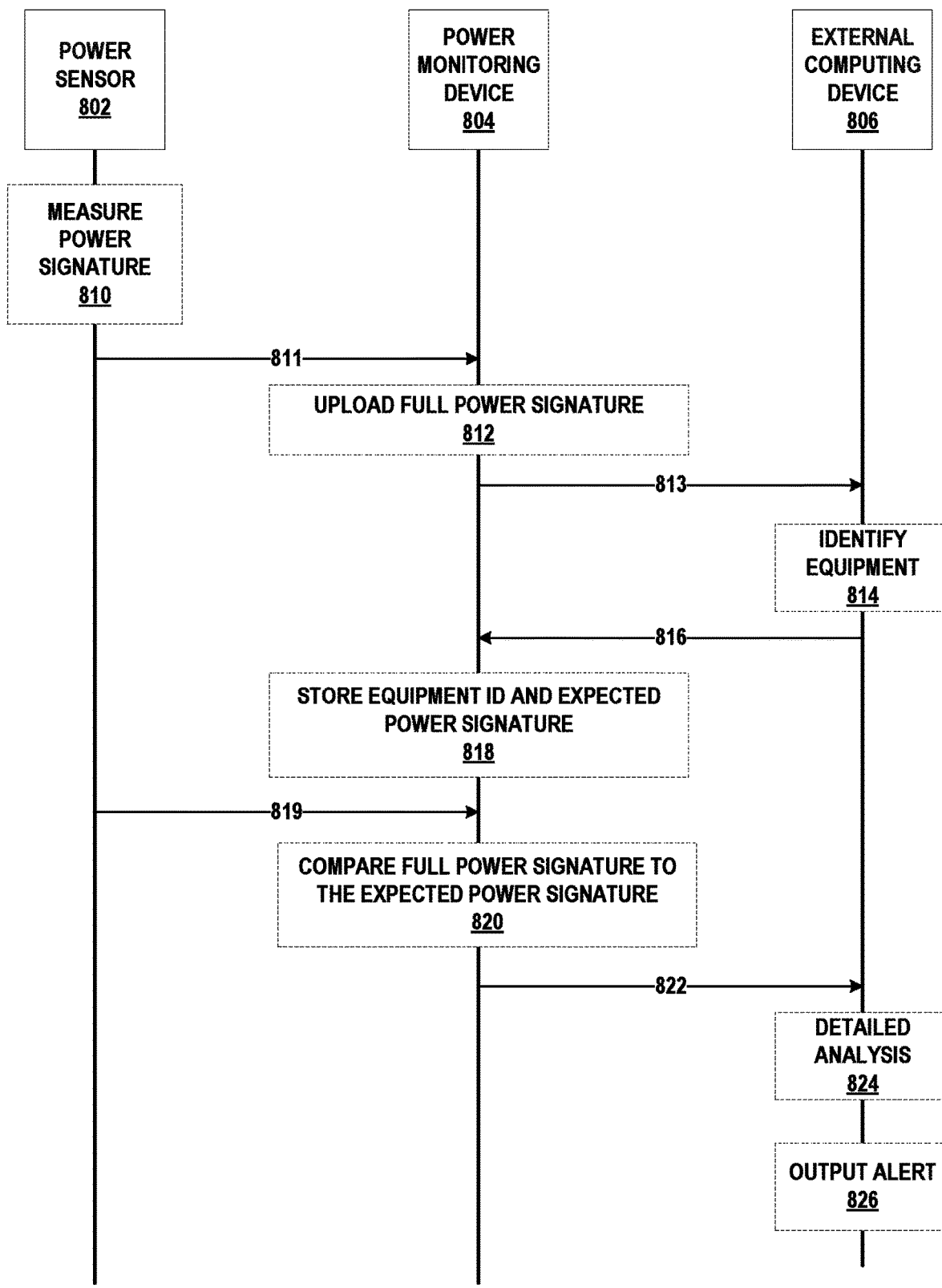
FIG. 8 is a flowchart illustrating an example communication by a power monitoring system according to one or more techniques of this disclosure.

FIG. 8 is a flowchart illustrating an example communication by a power monitoring system according to one or more techniques of this disclosure. Power sensor 802 may correspond to current transformers 414A-414C, described above in relation to FIG. 4, or to other types of power sensors. Power monitoring device 804 may correspond to sensor hub 402A or 602 described above in relation to FIGS. 4 and 6. External computing device 806 may include any of gateway 430, server 436, a cloud computing device or other computing device. In some examples, the processing circuitry of external computing device 806 may be more powerful, e.g. faster, include more operating memory, and be capable of more complex calculations than processing circuitry of power monitoring device 804. In this manner, the techniques of this disclosure may provide advantages over other types of equipment monitoring techniques by reducing cost, complexity, bandwidth and storage requirements, which may make equipment monitoring more widely available, such as to homeowners, small businesses and so on.

As described above in relation to FIGS. 4-6, power sensor 402 may measure the power signature for equipment to which power sensor 402 is attached (810). A power signature may be specific to particular types of equipment, e.g. a garage door opener, and may also be specific to certain types and models of equipment, e.g. a newer model blower motor may have a different signature than an older model blower motor from the same manufacturer.

Power monitoring device 804 may receive signals from power sensor 802 indicating the measured power signature (811). In some examples, power monitoring device 804 may upload a fully detailed power signature to external computing device 806 (813). For example, when first connected to equipment, power monitoring device 804 may record and send external computing device 806 a detailed power signature, which may consume bandwidth, computing resources and memory. However, external computing device 806 may need more detail in the power signature, e.g. at a tighter scale, to identify the equipment that power monitoring device 804 is monitoring. External computing device 806 may identify the equipment, e.g. the type of equipment, such as an HVAC system, and may identify specific components, e.g. type and brand of ignitor, blower motor, air conditioning unit, and so on (814).

Power monitoring device 804 may receive information from external computing device 806 (816) which may include an expected power signature for the equipment. In the example of equipment with multiple components, the information may include individual identification and expected power signatures for the components. Power monitoring device 804 may store the equipment identification and expected power signatures at a memory location accessible to power monitoring device 804.

Power monitoring device 804 may continue to monitor the power signature of the connected equipment (819). In some examples, the expected power signatures may be in a scalable format such that power monitoring device 804 may perform power analysis at a variety of complexity levels. For example, at a first scale, power monitoring device 804 may determine that the equipment performed an operational cycle, e.g. a furnace run, and the timing and expected power levels matched the expected power signature (820). Should power monitoring device detect an anomaly, power monitoring device may perform a more detailed comparison at a second scale. Based on the analysis, power monitoring equipment 804 may determine the state of health of the equipment.

In some examples, power monitoring device 804 may only upload information (822) about the state of health of the attached equipment if power monitoring detects a problem, e.g. a mismatch between the expected power signature and the actual power signature. In other examples, power monitoring device 804 may upload a brief message (822) to indicate the equipment operated as expected. In other examples, power monitoring device may upload a detailed power signature to indicate the state of health periodically, e.g. monthly, weekly, annually, or some other established period. In some examples, a power monitoring device may more important piece of equipment, such as a walk-in refrigerator holding business inventory, testing samples, etc. may be configured to upload more detailed state of health information compared to other equipment. In this manner, the power monitoring system of this disclosure may monitor the connected equipment, while minimizing bandwidth consumption, computing resources and memory storage, by scaling the amount of communication.

In some examples, external computing device 806 may perform more detailed analysis of the power signature than the power monitoring device (824). In some examples, external computing device 826 may output an alert (826) e.g. to a homeowner, business operator, or in some examples, to a maintenance team contracted to maintain the monitored equipment.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, equipment, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example examples are described herein with reference to the figures, which illustrate example methods, devices and program products according to various example examples. It will be understood that the actions and functionality may be implemented at least in part by program instructions. These program instructions may be provided to a processor of a device, a special purpose information handling device, or other programmable data processing device to produce a machine, such that the instructions, which execute via a processor of device 300 implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example examples were chosen and described in order to explain principles and practical application, and to enable others of ordinary skill in the art to understand the disclosure for various examples with various modifications as are suited to the particular use contemplated.

In one or more examples, the functions described above may be implemented in hardware, software, firmware, or any combination thereof. For example, the various components of FIGS. 1 and 2, such as single chip 110 and processors 222 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium. The term "non-transitory" may indicate that the storage medium is not embodied in a carrier wave or a propagated signal. In certain examples, a non-transitory storage medium may store data that can, over time, change (e.g., in RAM or cache).

By way of example, and not limitation, such computer-readable storage media, such as memory 240, memory 276, flash memory 180 and SDRAM 190 may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein, such as ECS controller 202, may refer to any of the foregoing structure or any other structure suitable for implementation of the techniques described herein. Also, the techniques could be fully implemented in one or more circuits or logic elements.

The techniques of this disclosure may be implemented in a wide variety of devices or equipment, including, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Thus, although illustrative example examples have been described herein with reference to the accompanying figures, it is to be understood that this description is not limiting and that various other changes and modifications may be affected therein by one skilled in the art without departing from the scope or spirit of the disclosure.

What is claimed is:

1. A device, comprising:
   current sensing circuitry,
      wherein the current sensing circuitry is configured to detect an electrical current traveling through a wire of equipment that the device is connected to;
   an energy harvester electrically coupled to the current sensing circuitry,
      wherein the energy harvester draws power from a signal associated with the current sensing circuitry;
   an energy storage device electrically coupled to the energy harvester,
      wherein energy harvested by the energy harvester charges the energy storage device;
   processing circuitry operatively coupled to the current sensing circuitry and configured to:
      determine a state of health of the equipment based on the detected electrical current at a first scale;
      in response to determining a problem in the state of health of the equipment based on the detected electrical current at the first scale, the processing circuitry is configured to determine the state of health of the equipment based on the detected electrical current at a second scale, the second scale being different than the first scale; and
   a communication device,
      wherein the communication device is configured to transmit information associated with the equipment to an external computing device,
         wherein the information comprises the state of health of the equipment based on the detected electrical current at the second scale.

2. The device of claim 1, further comprising a receptacle that accepts a plug,
   wherein the plug connects to the processing circuitry.

3. The device of claim 2, wherein the plug comprises a plurality of impedance components, and
   wherein connections between a subset of the plurality of impedance components identify a current rating for the current sensing circuitry.

4. The device of claim 3, wherein the device generates an alert responsive to identifying that the current rating for the equipment is above a current rating of the current sensing circuitry.

5. The device of claim 1, wherein the current sensing circuitry comprises a current transformer.

6. The device of claim 1, wherein the processing circuitry is configured to determine a performance of the equipment based on a current draw, cycle time, real power, reactive power, and current variability.

7. The device of claim 1, wherein the communication device comprises a wireless communication device and wherein communication device transmits the information wirelessly to the external computing device.

8. The device of claim 1, wherein the current sensing circuitry comprises a portion that is clamped around the wire.

9. The device of claim 1, wherein the device is within a power cord comprising the wire.

10. The device of claim 1, wherein the current sensing circuitry is a first current sensing circuitry, the device comprising a plurality of receptacles,
    wherein each of the plurality of receptacles accepts a respective plug connected to the first current sensing circuitry and a respective current sensing circuitry of a plurality of current sensing circuitry.

11. The device of claim 1, wherein the processing circuitry is configured to:
    identify parameters of the equipment by analyzing the current signal;
    receive an expected power consumption signature from the external computing device; and
    determine a state of health of the equipment based on comparing the analyzed current signal to the expected power consumption signature.

12. The device of claim 1, wherein the external computing device comprises a gateway device,
    wherein the gateway device analyzes the signal and sends results of the analysis to a data storage location.

13. The device of claim 1, further comprising:
    a memory chip configured to store firmware,
       wherein the firmware includes instructions executed by the processing circuitry.

14. A device, comprising:
    a current transformer,
       wherein the current transformer is configured to detect a current signal traveling through a wire of equipment that at least a portion of the device is clamped around;
    an energy harvester electrically coupled to the current transformer,
       wherein the energy harvester draws power from a signal generated by the current transformer;
    an energy storage device electrically coupled to the energy harvester,
       wherein energy harvested from the energy harvester charges the energy storage device;
    a processor operatively coupled to the current transformer and configured to:
       determine a state of health of the equipment based on the detected current signal at a first scale;
       in response to determining a problem in the state of health of the equipment based on the detected current signal at the first scale, the processor is configured to determine the state of health of the equipment based on the detected current signal at a second scale, the second scale being different than the first scale;

a communication device,
- wherein the communication device is configured to transmit information associated with the equipment to an external computing device,
- wherein the information comprises a state of health of the equipment based on the detected electrical current at the second scale; and a receptacle that accepts a plug,
- wherein connection of the plug allows identification of a current rating for the current transformer.

15. The device of claim 14, wherein the device generates an alert responsive to identifying the current rating for the equipment is above a current rating of the current transformer.

16. The device of claim 14, wherein the communication device comprises a wireless communication device, and
- wherein the wireless communication device transmits the information using an antenna to the external computing device.

17. The device of claim 14, wherein the current transformer is a first current transformer, the device comprising a plurality of receptacles, wherein each of the plurality of receptacles accepts a respective plug of a respective current transformer or a plurality of current transformers.

18. The device of claim 14, wherein the external computing device comprises a gateway device,
- wherein the gateway device analyzes the signal and sends results of the analysis to a data storage location.

* * * * *